United States Patent
Erpelding et al.

(10) Patent No.: US 7,158,348 B2
(45) Date of Patent: Jan. 2, 2007

(54) INTEGRATED LEAD SUSPENSION FOR USE IN A DISK DRIVE USING A TRI-METAL LAMINATE AND METHOD FOR FABRICATION

(75) Inventors: A. David Erpelding, San Jose, CA (US); Klaas Berend Klaassen, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 327 days.

(21) Appl. No.: 10/137,145

(22) Filed: May 1, 2002

(65) Prior Publication Data

US 2003/0206376 A1   Nov. 6, 2003

(51) Int. Cl.
    *G11B 5/48* (2006.01)
(52) U.S. Cl. .................. 360/245.9; 360/244.3
(58) Field of Classification Search ........... 360/245.9, 360/244.3; 428/458, 637, 645, 648
    See application file for complete search history.

(56) References Cited

U.S. PATENT DOCUMENTS

| | | | |
|---|---|---|---|
| 4,543,295 A | 9/1985 | St. Clair et al. | |
| 4,995,942 A | 2/1991 | David | |
| 5,427,848 A | 6/1995 | Baer et al. | |
| 5,817,574 A * | 10/1998 | Gardner | 438/637 |
| 5,862,010 A | 1/1999 | Simmons et al. | |
| 5,875,071 A | 2/1999 | Erpelding et al. | |
| 5,883,758 A | 3/1999 | Bennin et al. | |
| 5,924,187 A | 7/1999 | Matz | |
| 5,955,176 A | 9/1999 | Erpelding et al. | |
| 5,956,209 A | 9/1999 | Shum | |
| 5,982,584 A | 11/1999 | Bennin et al. | |
| 5,986,853 A | 11/1999 | Simmons et al. | |
| 6,282,064 B1 | 8/2001 | Palmer et al. | |
| 6,533,950 B1 | 3/2003 | Shum et al. | |
| 6,576,148 B1 | 6/2003 | Shum et al. | |
| 6,596,184 B1 | 7/2003 | Shum et al. | |
| 6,643,099 B1 * | 11/2003 | Bonin et al. | 360/234.5 |
| 6,785,094 B1 * | 8/2004 | Arya et al. | 360/244.3 |
| 6,898,841 B1 * | 5/2005 | Shiraishi | 29/603.04 |

* cited by examiner

*Primary Examiner*—Brian E. Miller
(74) *Attorney, Agent, or Firm*—Konrad Raynes & Victor, LLP; Alan S. Raynes

(57) ABSTRACT

An example of a multi-layer structure which may be used for supporting a transducer includes a support layer and an etch stop layer formed from a refractory metal on the support layer. A first electrically conducting layer of copper may be positioned on the etch stop layer. A dielectric layer may be provided on the first electrically conducting layer. A second electrically conducting layer of copper may be provided on the dielectric layer. The dielectric layer is positioned between the first electrically conducting layer and the second electrically conducting layer. The second electrically conducting layer may include a plurality of separate electrically conducting lines.

20 Claims, 4 Drawing Sheets

INTEGRATED LEAD SUSPENSION FOR USE IN A DISK DRIVE USING A TRI-METAL LAMINATE AND METHOD FOR FABRICATION

FIELD OF THE INVENTION

Embodiments of the present invention relate generally to disk drive systems and materials used in disk drive systems, including suspension structures, and methods for manufacturing the same.

DESCRIPTION OF RELATED ART

Magnetic storage systems typically include a rotatable magnetic disk having concentric data tracks defined for storing data, and a magnetic recording head or transducer for reading data from and writing data to the various data tracks. In typical disk drive systems, a stack of one or more magnetic disks is mounted over a spindle on a drive motor. The system also typically includes a head actuator for moving the magnetic recording head relative to the disk surfaces, and electronic circuitry for processing signals to implement various functions of the disk drive. Generally, it is desirable to reduce the disk spacing and make the disk drive as thin as possible.

The head is typically attached to a carrier or slider having an air bearing surface which is supported during operation adjacent to the data surface of the disk by a cushion of air generated by the rotating disk. The terms "head" and "slider" are sometimes both used to refer to the slider having a head attached thereon. The head is typically mounted on a gimbal that makes up at least part of a suspension assembly that connects the head to the actuator.

U.S. Pat. Nos. 5,986,853 and 5,862,010 describe transducer suspension systems including a multi-layered laminate structure, and are hereby incorporated by reference in their entirety. One example of a laminated structure described in the '853 and '010 patents includes five layers made up of alternating layers of copper and polyimide, with an underlying support layer of stainless steel. The copper layers may be have a thickness of 0.01 to 10.018 mm (10 to 10,018 µm), with a preferred thickness of 0.018 mm (18 µm). The polyimide layers may have a thickness of 0.005 to 0.018 mm (5 to 18 µm), with a preferred thickness of 0.018 mm (18 µm). The stainless steel support layer may have a thickness of 0.018 to 0.051 mm (18 to 51 µm), with a preferred thickness of 0.02 mm (20 µm).

SUMMARY

Certain embodiments of the present invention relate to a laminate structure including a support layer and an etch stop layer on the support layer, the etch stop layer having a thickness in the range of 250 to 5000 Angstroms. The structure also includes a first electrically conducting layer on the etch stop layer, a dielectric layer on the first electrically conducting layer, and a second electrically conducting layer on the dielectric layer.

Embodiments also relate to a laminate material including a support layer and an etch stop layer disposed on the support layer. The material also includes a first electrically conducting layer disposed on the etch stop layer, a dielectric material disposed on the first electrically conducting layer, and a second electrically conducting layer disposed on the dielectric layer. The dielectric layer is positioned between the first electrically conducting layer and the second electrically conducting layer. The etch stop layer comprises a material that is resistant to an etchant that etches the first and second electrically conducing layers and the support layer. The material of the etch stop layer is also resistant to an etchant that etches the dielectric material.

Embodiments also relate to a structure adapted to support a transducer in a disk drive system, including a support layer and an etch stop layer on the support layer. The structure also includes a first electrically conductive layer on the etch stop layer, a dielectric layer on the first electrically conductive layer, and a second electrically conductive layer on the dielectric layer. The etch stop layer is formed from a material having a lower electrical conductivity than that of the first and second electrically conductive layers.

Embodiments also relate to a method for forming a laminate material, including providing a support layer and forming an etch stop layer on a surface of the support layer. A first electrically conducting layer is formed on a surface of the etch stop layer. A second electrically conducting layer and a dielectric layer are coupled to the first electrically conducting layer so that the dielectric layer is positioned between the first electrically conducting layer and the second electrically conducting layer.

Embodiments also relate to a method for forming a laminate material, including providing a support layer and forming an etch stop layer on a surface of the support layer. The method also includes forming a first electrically conducting layer on a surface of the etch stop layer. A second electrically conducting layer and a dielectric layer are coupled to the first electrically conducting layer so that the dielectric layer is positioned between the first electrically conducting layer and the second electrically conducting layer. The etch stop layer is formed to be resistant to an etchant that etches the first and second electrically conducting layers, and the etch stop layer is formed to be resistant to an etchant that etches the dielectric layer.

Embodiments also relate to a method for forming a multi-layer structure adapted to support a transducer in a disk drive system, including providing a support layer and forming an etch stop layer comprising a refractory metal on the support layer. A first electrically conducting layer comprising copper is formed on the etch stop layer. A dielectric layer is provided on the first electrically conducting layer. A second electrically conducting layer comprising copper is provided on the dielectric layer; wherein the dielectric layer is positioned between the first electrically conducting layer and the second electrically conducting layer. The second electrically conducting layer is etched to form a plurality of separate electrically conducting lines.

Embodiments also relate to a disk drive including at least one disk and a rotatable hub for mounting the disk. The disk drive also includes a read/write head adapted to read from and write to the disk and a suspension adapted to support the head. The suspension includes a laminated structure including a support layer and first and second electrically conducting layers disposed above the support layer, a dielectric material disposed between the first and second electrically conducting layers, and an etch stop layer disposed between the support layer and the first electrically conducting layer. The etch stop layer is resistant to an etchant that etches the first and second electrically conducting layers. The etch stop layer is also resistant to an etchant that etches the dielectric material.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

While the invention is described in terms of the best mode for achieving this invention's objectives, it will be appreciated by those skilled in the art that variations may be accomplished in view of these teachings without deviating from the spirit or scope of the invention.

Figure 1:
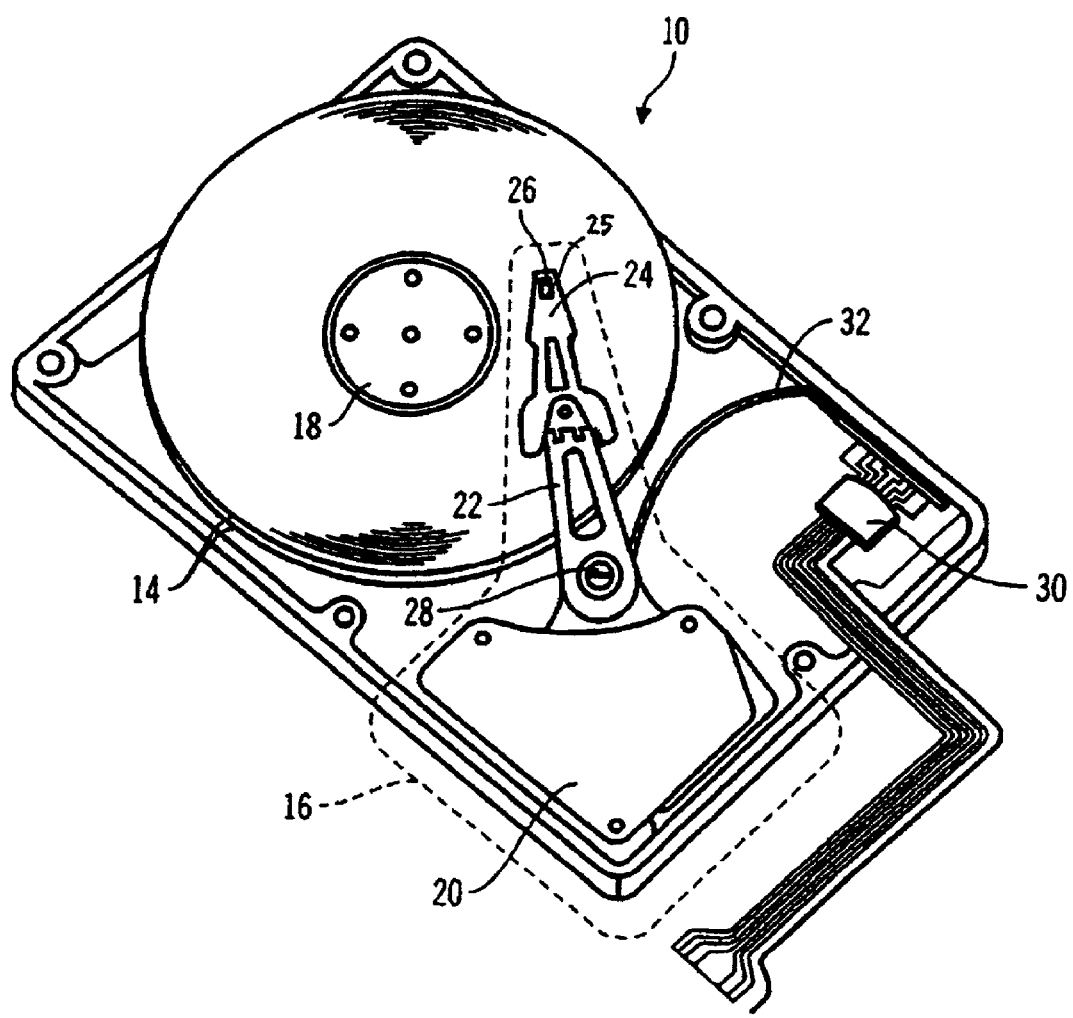
FIG. 1 illustrates a disk drive system in accordance with an embodiment of the present invention.

Certain embodiments relate to a multi-layer material structure than may be used in disk drive components. FIG. 1 illustrates a top view of a disk drive system in accordance with an embodiment of the present invention. The disk drive system includes one or more disks 14 stacked above one another. The disks 14 may be conventional particulate or thin film recording disks, which are capable of storing digital data in concentric tracks. Both sides of the disks 14 may be available for storage, and the stack may include any number of such disks 14. The disks 14 are mounted to a spindle 18. The spindle 18 is attached to a spindle motor, which rotates the spindle 18 and the disks 14 to provide read/write access to the various portions of the concentric tracks on the disks.

The disk drive system 10 illustrated in FIG. 1 also includes an actuator assembly 16 including voice coil motor assembly 20, which controls a head arm assembly which may include a positioner arm 22 and a suspension 24. The suspension 24 includes a read/write head 26 positioned at its distal end. Although only one read/write head 26 is shown, it will be recognized that the disk drive assembly 10 may include a read/write head for each side of each disk 14 included in the drive. The read/write head may include a transducer coupled to a slider. The positioner arm 22 may further include a pivot 28 around which the positioner arm 22 moves.

The disk drive system 10 may further include a read/write chip 30. As is known in the art, the read/write chip 30 cooperates with the read/write heads 26 to read data from and write data to the disks 14. A flexible printed circuit member 32 carries digital signals between the chip 30 and the actuator assembly 16. One or more electrical paths are routed along the positioner arm 22 and suspension 24 to carry electrical signals to and from the read/write head 26.

The suspension 24 generally includes a gimbal 25 on which the read/write head 26 is positioned. The suspension 24 may include integrated leads for carrying electrical signals to and from the head 26, and may have a variety of geometries and configurations, and may be formed from a variety of materials. It is possible for the gimbal to comprise the entire suspension 24. Alternatively, other structures including, but not limited to, a load beam (to which the flexure is coupled) may be part of the suspension assembly. The term integrated lead suspension (ILS) as used herein refers to a suspension having integrated leads, as opposed to a suspension having separate wires extending to the head.

Certain embodiments of the present invention relate to materials which may be used for forming disk drive components such as a suspension. Such materials may include multilayer laminated structures such as described in the related art section, including multiple layers of polyimide and copper. Such a structure may have problems such as an excessively thick structure that can limit mechanical performance and the ability to form smaller and more narrow disk drives. Certain embodiments of the present invention include a multilayer material structure that can be formed to have a substantially less thick structure, while having suitable mechanical properties.

Certain embodiments of the multi-layer material including a support layer, an etch stop layer, first and second conducting layers, and a dielectric layer positioned between the conducting layers. The etch stop layer is positioned between the support layer and the first conducting layer. The support layer may be formed from a variety of materials, for example, a rigid material such as stainless steel. The etch stop layer may also be formed from a variety of materials, including refractory metals such as molybdenum and tungsten. Other refractory metals may also be used, for example, titanium and tantalum, although they may be more limited in their removal processes (for example, titanium and tantalum may be more resistant to certain etchants than molybdenum and tungsten). In general, the refractory metals are not substantially etched by certain etchants used for patterning the other layers in the structure, which may include, for example, copper and polyimide. An example of such an etchant is ferric chloride. Suitable etch stop materials may also include other materials (other metals, insulators, etc.) which have suitable resistance to certain etchants and which have a lower electrical conductivity than the material used for the wiring lines.

Certain embodiments for manufacturing the multi-layer material include providing the support layer and sputter depositing the etch stop layer (for example, molybdenum) directly onto the support layer. In one embodiment, the thickness for the etch stop layer is 500 to 1000 Angstroms (0.05 to 0.1 µm). Other thicknesses may also be possible for the etch stop layer, for example, 250 to 5000 Angstroms (0.025 to 0.5 µm), and 250 to 2000 Angstroms (0.025 to 0.2 µm), depending on factors including, but not limited to, the process used for forming the layer and the material being used.

A first layer of electrically conducting material (for example, copper) may then by deposited over the etch stop layer using an electroplating method. Other methods for depositing the electrically conducting material, including, but not limited to, sputtering, may also be used.

A copper conducting layer may in certain embodiments be formed to have a thickness of about 1000 Angstroms (0.1 µm) or greater, typically up to about 25 µm (although other thicknesses are possible). An example of a thickness range is from 500 to 5000 Angstroms. The copper may be pure copper or a copper alloy. Pure copper will generally have a higher conductivity than typical copper alloys (such as C7025).

A dielectric layer and a second electrically conducting layer are formed over the first electrically insulating layer. The structure including the steps described above (including the sputter deposition of the etch stop layer) may be formed to be considerably less thick than prior art structures. Any type of process including standard lamination processes as known in the art may be used to adhere the dielectric layer and the second electrically conducting layer (such as a second copper layer) to the first copper layer. Such processes are described, for example, in U.S. Pat. Nos. 4,543,295 and 5,427,848, each of which is hereby incorporated by reference in its entirety. In one process a dielectric material such as a polyimide and thin sheet of copper, designated as C7025 copper alloy, are used. Heat and pressure are applied to couple the polyimide and thin sheet of copper (the second copper layer) to the first copper layer. The composition of each of the copper layers may vary, depending on factors such as, for example, the desired conductivity, the mechanical properties, and the processing methods used.

FIGS. 2–10 illustrate a material structure formed in accordance with an embodiment of the present invention and processing steps for forming a specific ILS structure in accordance with an embodiment of the present invention.

Figure 2:
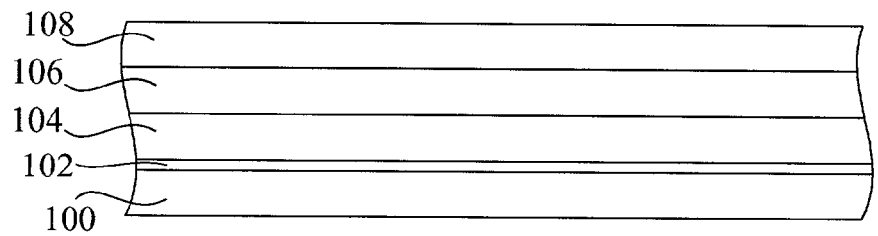
FIG. 2 illustrates a multi-layer material in accordance with an embodiment of the present invention.
Figure 3:
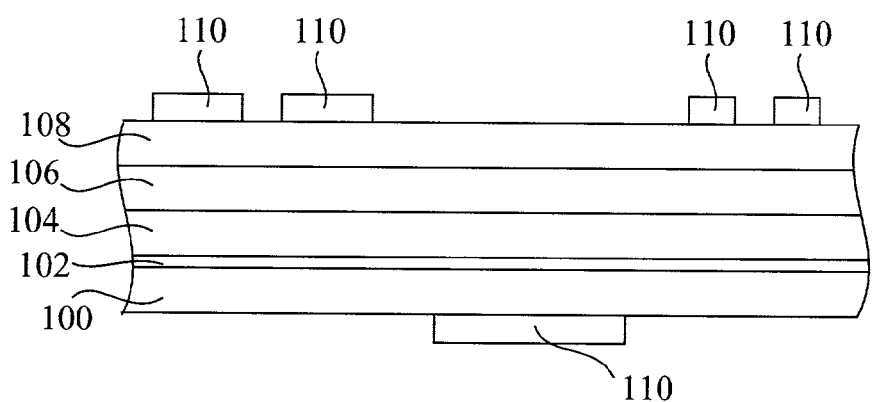
FIG. 3 illustrates a processing step for forming a multi-layer material structure in accordance with an embodiment of the present invention.
Figure 4:
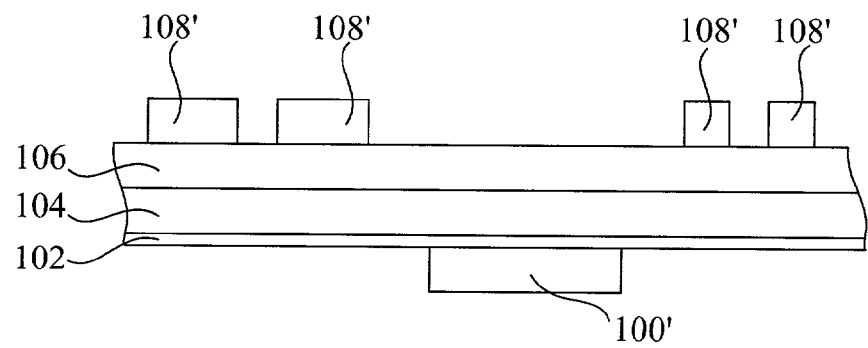
FIG. 4 illustrates a processing step for forming a multi-layer material structure in accordance with an embodiment of the present invention.

FIG. 2 shows a cross-section of a multi-layer structure including support layer 100, etch stop layer 102, copper layers 104 and 108 and dielectric layer 106. The etch stop layer is positioned between the support layer 100 and the copper layer 104, and the dielectric layer 106 is positioned between the copper layers 104 and 108. A standard photolithographic process, in which photoresist 110 is deposited and exposed, may be used to define patterns to be etched in the copper layer 108 and the stainless steel layer 100, as seen in FIG. 3. The copper layer 108 and stainless steel layer 100 are then etched (with the photoresist 110 as a mask) using an etchant such as a heated solution of ferric chloride, as known in the art. The photoresist may be removed using an ashing or chemical process as known in the art. As illustrated in FIG. 4, the copper layer 108 has been etched into individual copper conductors 108' and the stainless steel support layer 100 has been etched into a stainless steel region 100' having a desired shape for mechanical properties.

Figure 5:
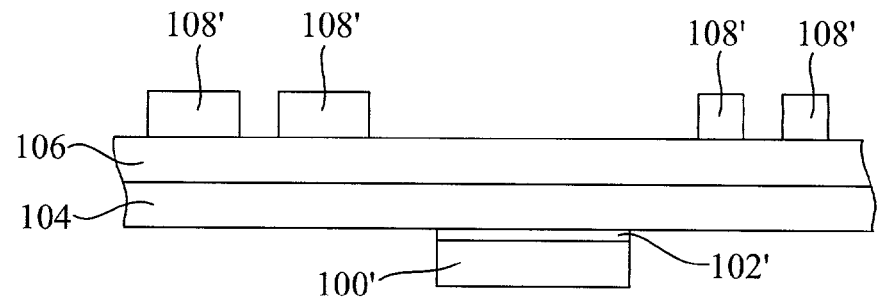
FIG. 5 illustrates a processing step for forming a multi-layer material structure in accordance with an embodiment of the present invention.

The etch stop layer 102 may then be etched using the stainless steel region 100' as a mask, to form etch stop region 102', as seen in FIG. 5. The etching may be carried out using a variety of etching processes, including, for example, a sputter etch process or a chemical etch process such as that taught in U.S. Pat. No. 4,995,942, which is hereby incorporated by reference in its entirety. The etching process may be selected so that it does not substantially etch the stainless steel region 100' or the copper layer 104, and therefore a photolithographic step is not necessary.

Figure 6:
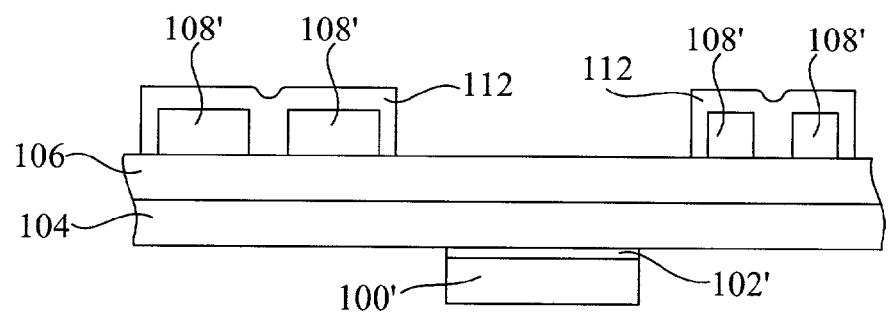
FIG. 6 illustrates a processing step for forming a multi-layer material structure in accordance with an embodiment of the present invention.
Figure 7:
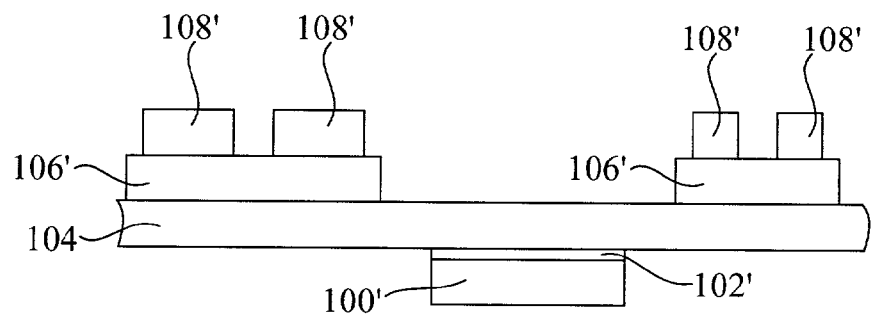
FIG. 7 illustrates a processing step for forming a multi-layer material structure in accordance with an embodiment of the present invention.

The dielectric layer 106 may be patterned using a photolithographic process, as seen in FIG. 6, with a photoresist 112 being formed into a desired pattern. Alternatively, a photolithographic process may be skipped and the pattern of the copper regions 108' may be used as the pattern to define the dielectric layer. Such a technique of using a metal layer as a pattern or mask is known in the art. After etching (and if a photolithographic process was used, removal of photoresist), the dielectric layer has been processed into individual dielectric regions 106' as illustrated in FIG. 7.

Figure 8:
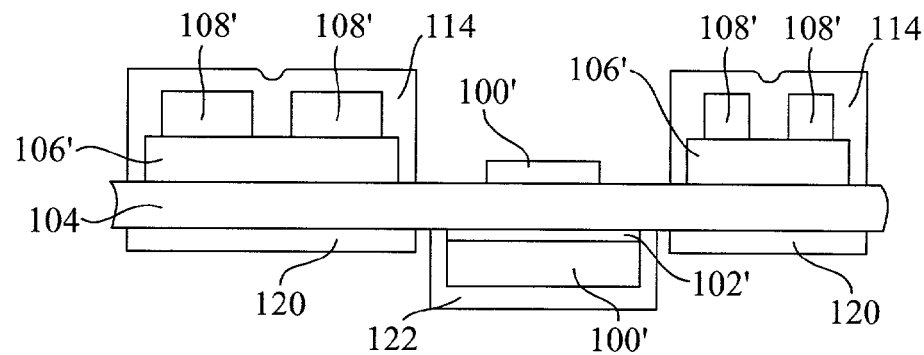
FIG. 8 illustrates a processing step for forming a multi-layer material structure in accordance with an embodiment of the present invention.
Figure 9:
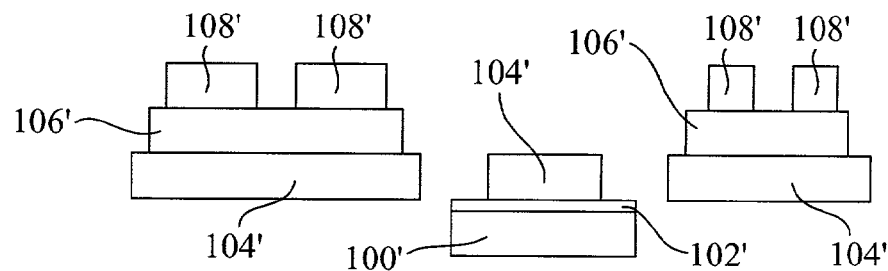
FIG. 9 illustrates a processing step for forming a multi-layer material structure in accordance with an embodiment of the present invention.

The copper layer 104 may be processed using photolithographic techniques. For example, FIG. 8 illustrates resist regions 114 covering the copper conductors 108' and dielectric regions 106' over the upper surface of the conducting layer 104, a resist region 116 covering a central region on the upper surface of the conducting layer 104, resist regions 120 covering portions of the lower surface of the conducting layer 104 corresponding to the resist regions 114 on the upper surface of the conducing layer 104, and a resist region 122 covering the stainless steel region 100' and etch stop region 102' on the lower surface of the conducting layer 104. FIG. 9 illustrates the structure after etching, which yields copper layer regions 104'.

Figure 10:
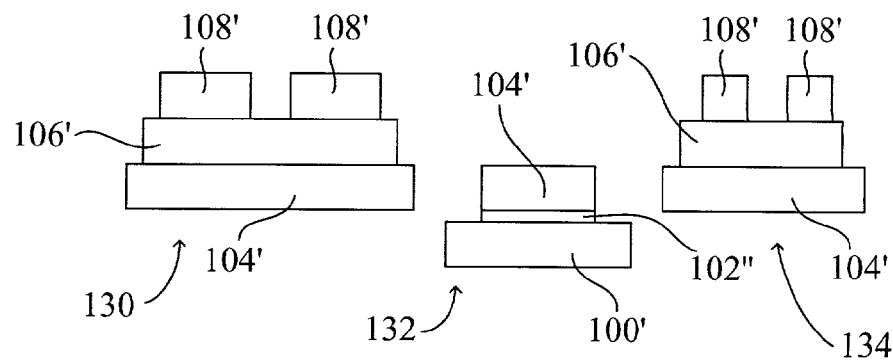
FIG. 10 illustrates a processing step for forming a multi-layer material structure in accordance with an embodiment of the present invention.

The etch stop layer 102' that remains beyond the boundaries of the center copper layer region 104' may also be etched, if desired, to yield etch stop region 102" between the support region 100' and central copper layer region 104', as illustrated in FIG. 10.

It should be appreciated that the embodiment illustrated in FIG. 10, while appearing as three unconnected sections designated 130, 132 and 134 at the specific cross-sectional plane illustrated, will in fact be coupled together at regions not shown in FIG. 10.

In the embodiment illustrated in FIG. 10, the four copper layer regions 108' may, for example, be considered as conduction lines, with the two regions 108' on the left side of the figure being read lines and the two regions 108' on the right side being write lines. The conduction lines may also have different sizes, for example, as seen in FIG. 10, the two lines 108' on the left side of the figure are wider than the two lines 108' on the right side of the figure. In addition, the conducting layer regions 104' that are positioned beneath the region 108' may act as ground plane lines.

Embodiments of the present invention include a variety of structures in addition to the specific structure illustrated in FIG. 10. An integrated lead suspension (ILS) may be formed using a multi-layer structure including the support layer, etch stop layer, lower conducting layer, dielectric layer and second conducting layer as shown in FIG. 2, with the specific geometric layout of the specific layers after processing having a wide range of configurations. The multi-layer material structure enables an ILS to be designed in a variety of ways, for example, with a ground plane under conducting lines, or with stacked conducting lines. Stacked conductors or a ground plane are methods for improving the suspension's electrically characteristic impedance by making it less sensitive to the skin effect. The skin effect causes undesirable high frequency signal loses which in turn increase the rise and fall time of the signal. Stacked conductors or a ground plane may also provide shielding from electromagnetic (EM) noise, for improving data flow rate.

In one embodiment, the first electrically conducting layer is pure copper (electroplated), the second electrically conducting layer is C7024 copper, the support is stainless steel, and the etch stop layer is a refractory metal. In such an embodiment, if the ILS design calls for a ground plane structure, the electrical conductivity from the first conducting layer (pure copper) through the etch stop layer and into the stainless steel layer will have little or no deleterious effects. Current generated from EM noise will preferentially travel in the higher conductivity pure copper layer (first conducting layer). If the ILS design calls for stacked conductors, the conductivity of the pure copper layer (first conducting layer) adjacent to the etch stop and stainless steel layer, is considerably higher and will carry the data signals without substantial effects from the etch stop or the stainless steel layers.

It will, of course, be understood that modifications of the present invention, in its various aspects, will be apparent to those skilled in the art. Additional embodiments are possible, their specific features depending upon the particular application. For example, a variety of materials and processes may be used for forming the various layers of the structure and for connecting the various layers of the structure, including, but not limited to, plating (including, but not limited to electroplating), chemical vapor deposition, sputtering, and applying heat and/or pressure to connect preformed layers to one another. Terms such as "vacuum deposited", "vacuum depositing", "vacuum formed" and "vacuum process" relate to processes which are carried out at very low pressures. Such processes will typically use a vacuum pump to achieve the desired pressures. Examples of such processes include, but are not limited to, evaporation, sputtering and chemical vapor deposition. In addition, the layered structure that is illustrated above the support layer 100 in FIG. 2 could also be reproduced below the support layer. Furthermore, a greater number of layers (including, for example, electrically conducting, dielectric, and/or etch stop layers) than those illustrated in FIG. 2 may also be present in certain embodiments. Embodiments may be applicable to a variety of disk drives and structures within a disk drive system in addition to those discussed above.

What is claimed:

1. A laminate structure comprising:
   a support layer;
   an etch stop layer on the support layer, the etch stop layer having a thickness in the range of 250 to 5000 Angstroms;
   a first electrically conducting layer in contact with the etch stop layer;
   a dielectric layer on the first electrically conducting layer; and
   a second electrically conducting layer on the dielectric layer;
   wherein the etch stop layer is formed from a material having a different composition than that of the support layer, the first electrically conducting layer, the dielectric layer, and the second electrically conducting layer.

2. A laminate structure as in claim 1, wherein the etch stop layer has a thickness in the range of 250 to 2000 Angstroms.

3. A laminate structure as in claim 1, wherein the etch stop layer has a thickness in the range of 500 to 1000 Angstroms.

4. A laminate structure as in claim 1, wherein the etch stop layer comprises a refractory metal.

5. A laminate structure as in claim 1, wherein the etch stop layer comprises at least one material selected from the group consisting of molybdenum, tungsten, titanium and tantalum.

6. A laminate structure as in claim 1, wherein the first conducting layer has a thickness that is less than that of the second conducting layer, and the etch stop layer has a thickness that is smaller than that of the dielectric material.

7. A laminate structure as in claim 1, wherein the first and second electrically conducting layers each comprise copper.

8. A laminate structure as in claim 7, wherein the first electrically conducting layer includes a higher percentage of copper than the second electrically conducting layer.

9. A laminate structure as in claim 8, wherein the dielectric material comprises a polyimide and the support layer comprises stainless steel.

10. A laminate structure as in claim 1, wherein the first electrically conducting layers is formed to have a thickness of 500 to 5000 Angstroms.

11. A laminated material as in claim 1 wherein the etch stop layer comprises a vacuum deposited material.

12. A laminate structure comprising:
    a support layer;
    an etch stop layer disposed on the support layer;
    a first electrically conducting layer disposed on the etch stop layer;
    a dielectric material disposed on the first electrically conducting layer; and
    a second electrically conducting layer disposed on the dielectric layer, the dielectric layer being positioned between the first electrically conducting layer and the second electrically conducting layer;
    wherein the etch stop layer is formed from a material having a different composition than that of the first electrically conductive layer and the second electrically conducting layer, and wherein the etch stop layer comprises a refractory metal.

13. A laminate structure as in claim 12, wherein the etch stop layer comprises a material selected from the group consisting of molybdenum and tungsten.

14. A laminate structure as in claim 12, wherein the etch stop layer comprises a material selected from the group consisting of molybdenum, tungsten, titanium and tantalum.

15. A laminate structure as in claim 12,
    wherein the first electrically conducting layer is formed from pure copper;
    the second electrically conducting layer is formed from a copper alloy;
    the dielectric layer comprises a polyimide; and
    the support layer comprises stainless steel.

16. A laminate structure as in claim 12, wherein the first electrically conducting layer comprises a material selected from the group consisting of electroplated copper and vacuum deposited copper.

17. A laminate structure, comprising:
    a support layer;
    an etch stop layer disposed on the support layer;
    a first electrically conducting layer disposed in contact with the etch stop layer;
    a dielectric material disposed on the first electrically conducting layer; and
    a second electrically conducting layer disposed on the dielectric layer, the dielectric layer being positioned between the first electrically conducting layer and the second electrically conducting layer;
    wherein the etch stop layer is formed from a material having a different composition than that of the support layer, the first electrically conducting layer, the dielectric layer, and the second electrically conducting layer, and wherein the material has a lower electrical conductivity than that of the first electrically conducting layer and the second electrically conducting layer.

18. A laminate structure as in claim 17, wherein the etch stop layer is formed from an insulating material.

19. A laminate structure as in claim 17, wherein the etch stop layer is formed from a metallic material.

20. A laminate structure as in claim 17, wherein the etch stop layer is formed from a material selected from the group consisting of molybdenum and tungsten.

* * * * *